(12) United States Patent
Daicho et al.

(10) Patent No.: US 7,385,349 B2
(45) Date of Patent: Jun. 10, 2008

(54) LIGHT EMITTING MODULE AND LIGHTING UNIT FOR VEHICLE

(75) Inventors: Hisayoshi Daicho, Shizuoka (JP); Hitoshi Takeda, Shizuoka (JP); Yasuaki Tsutsumi, Shizuoka (JP); Hidekazu Hayama, Kyoto (JP); Kenji Yamada, Kyoto (JP)

(73) Assignee: Koito Manufacturing Co., Ltd., Tokyo (JP)

( * ) Notice: Subject to any disclaimer, the term of this patent is extended or adjusted under 35 U.S.C. 154(b) by 126 days.

(21) Appl. No.: 11/029,627

(22) Filed: Jan. 6, 2005

(65) Prior Publication Data

US 2006/0291226 A1   Dec. 28, 2006

(30) Foreign Application Priority Data

Jan. 7, 2004   (JP)   .............................. 2004-002442

(51) Int. Cl.
*H01J 1/62*   (2006.01)
(52) U.S. Cl. .................. 313/512; 313/485; 313/486; 257/98; 257/79; 257/103; 252/301.4 R; 252/301.4 F; 252/301.4 H
(58) Field of Classification Search ......... 313/483–487, 313/489, 512; 257/98–100; 315/82, 83
See application file for complete search history.

(56) References Cited

U.S. PATENT DOCUMENTS 4,849,296 A * 7/1989 Haluska et al. ............. 428/457

| | | | |
|---|---|---|---|
| 6,586,775 B2 * | 7/2003 | Hirayama | 257/98 |
| 6,614,179 B1 | 9/2003 | Shimizu et al. | |
| 6,734,465 B1 * | 5/2004 | Taskar et al. | 257/80 |
| 6,982,046 B2 * | 1/2006 | Srivastava et al. | 252/301.4 R |
| 2001/0048966 A1 | 12/2001 | Trumble et al. | |
| 2002/0180351 A1 | 12/2002 | McNulty et al. | |
| 2003/0094626 A1 | 5/2003 | Duggal et al. | |
| 2004/0263073 A1 * | 12/2004 | Baroky et al. | 313/512 |
| 2007/0018181 A1 * | 1/2007 | Steen et al. | 257/98 |

FOREIGN PATENT DOCUMENTS

| | | |
|---|---|---|
| CN | 1404495 A | 3/2003 |
| DE | 103 16 769 A1 | 10/2004 |
| EP | 1369935 A1 | 12/2003 |
| WO | WO 00/17903 A2 | 3/2000 |
| WO | WO 02/089175 A1 | 11/2002 |
| WO | WO 03/093393 A1 | 11/2003 |
| WO | WO 03/105242 A1 | 12/2003 |
| WO | WO 03/107441 A2 | 12/2003 |

* cited by examiner

*Primary Examiner*—Kiesha Rose
*Assistant Examiner*—Donald L Raleigh
(74) *Attorney, Agent, or Firm*—Sughrue Mion, PLLC (57) ABSTRACT

A light emitting module for generating a light includes a semiconductor light emitting unit for generating a light, a plurality of nanophosphor particles having diameters which are smaller than a half-wavelength of the light generated from the light emitting module and serving to emit a fluorescent light corresponding to the light generated from the semiconductor light emitting unit, and a binder for holding the nanophosphor particles like a layer covering a light emitting surface of the semiconductor light emitting unit. Furthermore, a lighting unit for a vehicle includes the light emitting module.

13 Claims, 8 Drawing Sheets

| MATERIAL | CHANGE IN TRANSMITTANCE | CHANGE IN APPEARANCE |
|---|---|---|
| DIEMETHYL SILICONE | VERY SMALL | NONE |
| PHENYL SILICONE | LARGE | CRACK |
| METHYL TYPE SILSESQUIOXANE | VERY SMALL | NONE |
| METHYL PHENYL TYPE SILSESQUIOXANE | LARGE | NONE |
| ALICYCLIC TYPE SILSESQUIOXANE | VERY SMALL | NONE |

FIG. 8

LIGHT EMITTING MODULE AND LIGHTING UNIT FOR VEHICLE

This patent application claims the benefit foreign priority under 35 USC 119 based on Japanese Patent Application No. JP2004-002442, filed on Jan. 7, 2004, the contents of which is incorporated herein by reference. This claim is being made concurrently with the filing of the U.S. patent application.

BACKGROUND OF THE INVENTION

1. Technical Field

The present invention relates to a light emitting module and a lighting unit for a vehicle.

2. Related Art

In the related art, there has been known a light emitting module for generating a white light by utilizing a semiconductor light emitting unit and a phosphor (for example, see Ohm MOOK Light Series No. 1 "Optical Device" Ohmsha, Nov. 25, 2001). The phosphor generates a fluorescent light corresponding to a light emitted from the semiconductor light emitting unit.

In the light emitting module, a phosphor is formed like a layer over the light emitting surface of the semiconductor light emitting unit, for example. In this case, however, the layer of the phosphor has a thickness. For this reason, a light generated from a phosphor to be a lower layer is sometimes intercepted by a phosphor that is an upper layer. In these cases, a part of the light generated from the phosphor is lost. For this reason, the external quantum efficiency of the light emitting module is reduced. In the related art, therefore, it is difficult to provide a light emitting module having a high external quantum efficiency.

SUMMARY OF THE INVENTION

It is an object of the invention to provide a light emitting module and a lighting unit for a vehicle which can solve at least the above-described related art problem. However, the present invention may address the foregoing object, other objects, or no objects at all.

A first aspect of the present invention is directed to a light emitting module for generating a light, comprising a semiconductor light emitting unit for generating a light, a plurality of nanophosphor particles having diameters which are smaller than a half-wavelength of the light generated from the light emitting module respectively and serving to emit a fluorescent light corresponding to the light generated from the semiconductor light emitting unit, and a binder for holding the nanophosphor particles like a layer covering a light emitting surface of the semiconductor light emitting unit.

Moreover, the nanophosphor particle may have a diameter of about 2 to 10 nm. The nanophosphor particle may have a diameter which is larger than about 10 nm and is equal to or smaller than a ¼ wavelength of a visible light. In addition, the semiconductor light emitting unit may generate an ultraviolet light, and the nanophosphor particle may generate a visible light corresponding to the ultraviolet light generated from the semiconductor light emitting unit.

Furthermore, the binder may be formed by a fluorine resin or a dimethyl silicone resin in order to cover the light emitting surface of the semiconductor light emitting unit with the nanophosphor particles included therein.

In addition, the binder may be formed by a silsesquioxane resin in order to cover the light emitting surface of the semiconductor light emitting unit with the nanophosphor particles included therein, and a side chain of the silsesquioxane resin may be alkyd having no double bond or an alicyclic group.

Moreover, it is also possible to further comprise a plurality of metal oxide particles having diameters substantially equal to or smaller than a half-wavelength of an ultraviolet light respectively and is held in the binder together with the nanophosphor particles.

Furthermore, it is also possible to further comprise a sealing member formed by a material to transmit a visible light and sealing the binder and the semiconductor light emitting unit in order to cover the binder and the semiconductor light emitting unit, and the nanophosphor particles held in the binder may convert, into visible lights, all of the ultraviolet lights generated from the semiconductor light emitting unit. In addition, the sealing member may be formed by an epoxy resin.

Moreover, it is also possible to further comprise a plurality of large diameter phosphor particles having diameters which are larger than a half-wavelength of the visible light and serving to generate a visible light having a different wavelength from a wavelength of the visible light generated from the nanophosphor particle corresponding to an ultraviolet light, and the binder may include a first holding layer formed to cover the light emitting surface of the semiconductor light emitting unit and serving to hold the large diameter phosphor particles on the light emitting surface, and a second holding layer formed opposite to the light emitting surface with the first holding layer interposed therebetween and serving to hold the nanophosphor particles on the first holding layer, the large diameter phosphor particles held in the first holding layer converting, into a visible light, a part of an ultraviolet light generated from the semiconductor light emitting unit, the first holding layer transmitting, to the second holding layer, a part of the ultraviolet light generated from the semiconductor light emitting unit and the visible lights generated from the large diameter phosphor particles, the nanophosphor particles held in the second holding layer converting, into visible lights, all of ultraviolet lights incident from the first holding layer, and the second holding layer transmitting the visible lights generated from the large diameter phosphor particles and the visible lights generated from the nanophosphor particles to an outside of the binder.

A second aspect of the invention is directed to a lighting unit for a vehicle which generates a light, comprising a light emitting module for generating a light, and an optical member for irradiating the light generated from the light emitting module onto an outside of the lighting unit, the light emitting module having a semiconductor light emitting unit for generating a light, a plurality of nanophosphor particles having diameters which are smaller than a half-wavelength of the light generated from the light emitting module respectively and serving to generate a fluorescent light corresponding to the light generated from the semiconductor light emitting unit, and a binder for holding the nanophosphor particles like a layer covering a light emitting surface of the semiconductor light emitting unit.

Further, any subcombination of the foregoing feature groups can also be included in the invention.

DETAILED DESCRIPTION OF THE INVENTION

While the invention will be described below with reference to an embodiment according to the invention, the following embodiment does not restrict the invention according to claims, and all of the combinations of features described in the embodiment are not indispensable to means for solving the invention.

Figure 1:
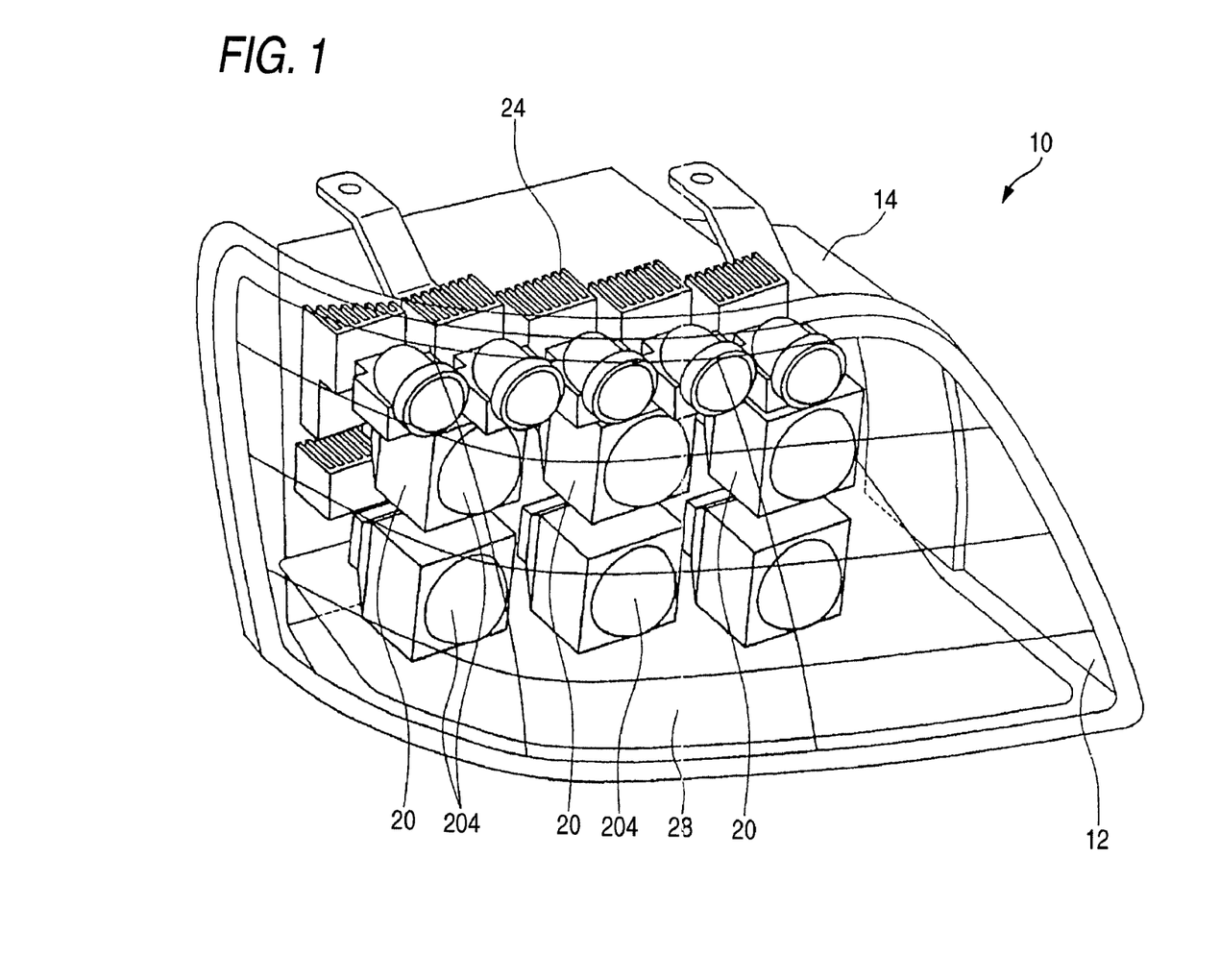
FIG. 1 is a perspective view showing a lighting unit for a vehicle according to an exemplary, non-limiting embodiment of the present invention.
Figure 2:
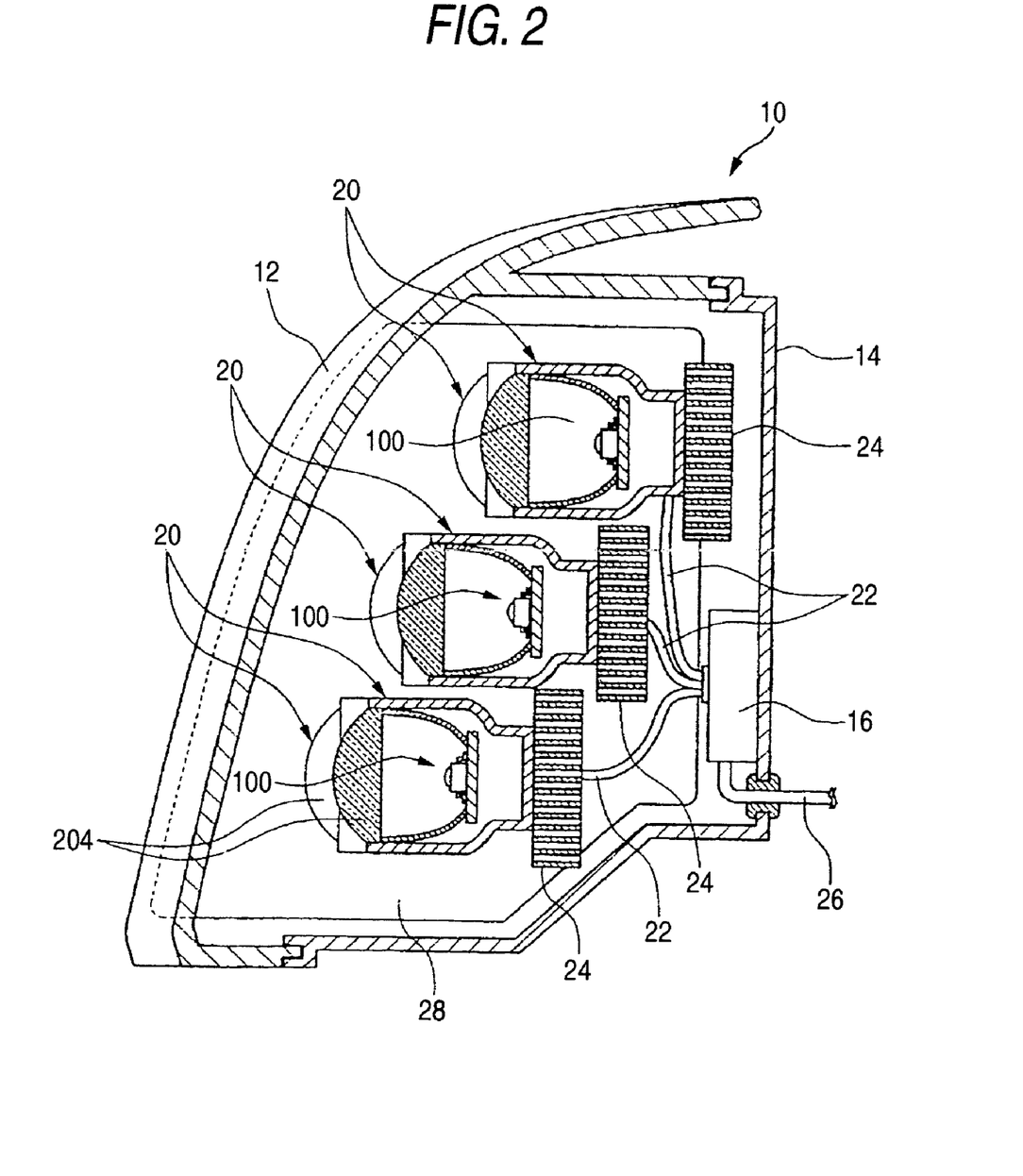
FIG. 2 is a horizontal sectional view showing the lighting unit for a vehicle according to the exemplary, non-limiting embodiment of the present invention.

FIGS. 1 and 2 show an exemplary, non-limiting embodiment of the structure of a lighting unit 10 for a vehicle according to the present invention. FIG. 1 is a perspective view showing the lighting unit 10 for a vehicle. FIG. 2 is a horizontal sectional view showing the lighting unit 10 for a vehicle through a horizontal plane crossing a light source unit 20 in a middle stage. This embodiment is intended for efficiently generating a light from a phosphor provided in an LED module 100.

The lighting unit 10 is a headlamp for use in a vehicle such as a car, and irradiates a light onto the forward part of the vehicle. The lighting unit 10 for a vehicle comprises a plurality of light source units 20, a cover 12, a lamp body 14, a circuit unit 16, a plurality of radiating members 24, an extension reflector 28, and cables 22 and 26.

Each of the light source units 20 has an LED module 100 and a lens 204. The LED module 100 is an example of a light emitting module, and generates a white light corresponding to a power received from the circuit unit 16 through the cable 22. The lens 204 is an example of an optical member, and irradiates a light emitted from the LED module 100 onto the outside of the lighting unit 10.

Consequently, the light source unit 20 irradiates a light having a light distribution pattern onto the forward part of the vehicle based on the light generated from the LED module 100. The light source unit 20 is supported on the lamp body 14 tiltably by means of an aiming mechanism for adjusting the direction of the optical axis of the light source unit 20, for example but not by way of limitation. The light source unit 20 may be supported on the lamp body 14 such that the direction of the optical axis is turned downward at approximately 0.3 to 0.6 degree, for example but not by way of limitation, in the case in which the lighting unit 10 for a vehicle is attached to a body.

The light source units 20 may have identical or similar light distribution characteristics, or may have substantially different light distribution characteristics from each other. In another example, one light source unit 20 may have a plurality of LED modules 100. The light source unit 20 may have a semiconductor laser as a light source module in place of the LED module 100, for example.

The cover 12 and the lamp body 14 form the lamp housing of the lighting unit 10 for a vehicle, and the light source units 20 are accommodated in the lamp housing. It is preferable that the cover 12 and the lamp body 14 should make the light source unit 20 airtight and watertight. However, the present invention is not limited thereto.

The cover 12 is formed to be transparent by a material for transmitting the light generated from the LED module 100 and is provided on the front face of the vehicle to cover the forward part of the light source units 20. The lamp body 14 is provided to cover the light source units 20 from a rear part opposite to the cover 12 with the light source units 20 interposed therebetween. The lamp body 14 may be formed integrally with the body of the vehicle.

The circuit unit 16 is a module in which a lighting circuit for turning on the LED module 100 is formed. The circuit unit 16 is electrically connected to the light source unit 20 through the cable 22. Moreover, the circuit unit 16 is electrically connected to the outside of the lighting unit 10 for a vehicle through the cable 26.

The radiating members 24 are heat sinks provided in contact with at least a part of the light source units 20. The radiating member 24 is formed by a material having a higher thermal conductivity than air, for example but not by way of limitation, a metal. The radiating member 24 is movable together with the light source unit 20 within a range in which the light source unit 20 is moved with respect to the fulcrum of the aiming mechanism, for example, and is provided with a sufficient interval for adjusting the optical axis of the light source unit 20 with respect to the lamp body 14. The radiating members 24 may optionally be formed integrally by a metal member. In this case, heat can be efficiently radiated from the whole radiating members 24.

The extension reflector 28 is a reflecting mirror formed by a thin metal plate over the cover 12 from the lower part of the light source units 20, for example. The extension reflector 28 is formed to cover at least a part of the internal surface of the lamp body 14. Consequently, the shape of the internal surface of the lamp body 14 is hidden and the appearance of the lighting unit 10 for a vehicle can be enhanced.

Moreover, at least a part of the extension reflector 28 comes in contact with the light source unit 20 and/or the radiating member 24. In this case, the extension reflector 28 has the function of a heat conducting member for conducting a heat generated from the LED module 100 to the cover 12. Consequently, the extension reflector 28 causes the LED module 100 to radiate a heat. Moreover, a part of the extension reflector 28 is fixed to the cover 12 or the lamp body 14. The extension reflector 28 may be formed like a frame for covering the upper, lower and side parts of the light source units 20.

According to the example, it is possible to reduce the size of the light source unit 20 by using the LED module 100 as a light source. Consequently, the degree of freedom of the arrangement of the light source unit 20 can be enhanced. Thus, it is possible to provide the lighting unit 10 for a vehicle having a high designing property.

Figure 3:
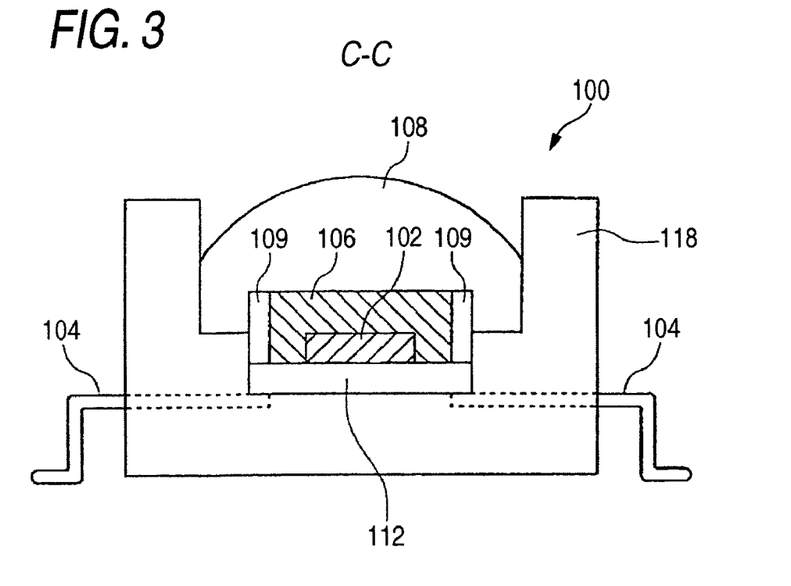
FIG. 3 is a CC sectional view showing an LED module according to the exemplary, non-limiting embodiment of the present invention.
Figure 4:
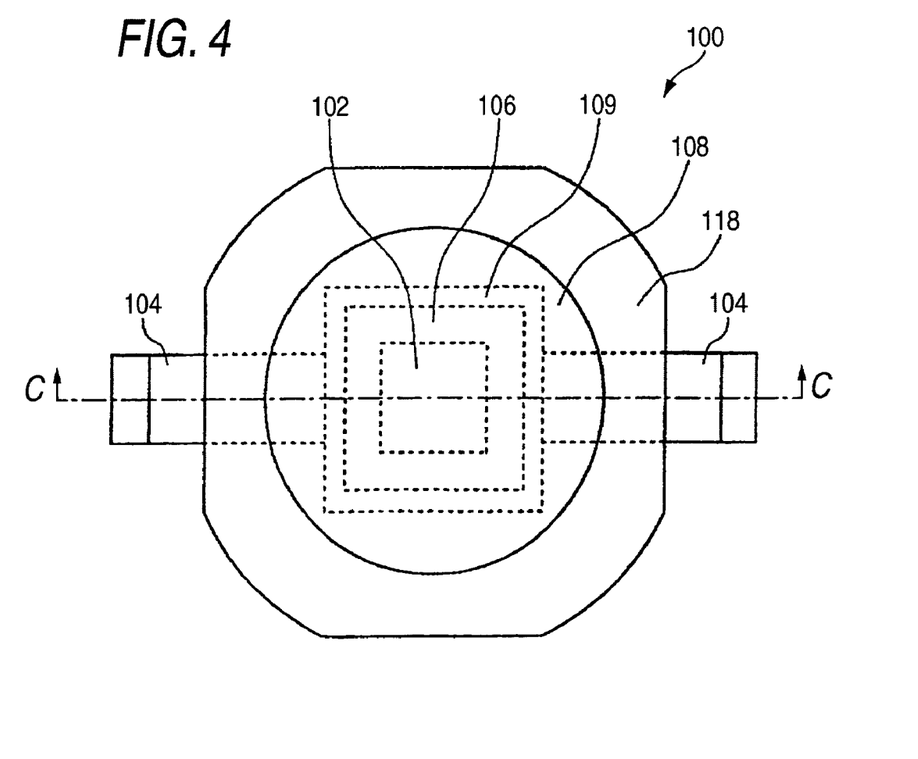
FIG. 4 is a top view showing the LED module according to the exemplary, non-limiting embodiment of the present invention.

FIGS. 3 and 4 show an exemplary, non-limiting structure of the LED module 100. FIG. 3 is a CC sectional view showing the LED module 100. FIG. 4 is a top view showing the LED module 100. The LED module 100 has a substrate 112, a plurality of electrodes 104, a cavity 109, a holding portion 118, a sealing member 108, a light emitting diode unit 102, and a fluorescent portion 106.

The substrate 112 is a plate-shaped member for mounting the light emitting diode unit 102 on an upper surface and fixing the light emitting diode unit 102 thereto. The substrate 112 includes a wiring for electrically connecting the electrode 104 to the light emitting diode unit 102 and supplies a power received from the electrodes 104 to the light emitting diode unit 102. The electrodes 104 supply a power received from the outside of the LED module 100 to the light emitting diode unit 102 through the substrate 112. The cavity 109 is formed on the substrate 112 to surround the light emitting diode unit 102 and holds the fluorescent portion 106 therein.

The holding portion 118 holds the electrodes 104, the substrate 112, the cavity 109 and the sealing member 108. Moreover, at least a part of the holding portion 118 is formed by a material having a higher thermal conductivity than the air, for example, a metal, and transmits a heat generated by the light emitting diode unit 102 to the outside of the LED module 100.

The light emitting diode unit 102 is an example of a semiconductor light emitting unit for generating a light, and serves to generate an ultraviolet light corresponding to a power received from the outside of the LED module 100 through the electrode 104 and the substrate 112. In another example, the light emitting diode unit 102 may generate a blue light in place of the ultraviolet light, for example. However, the present invention is not limited thereto, and any color can be used, as would be known by one skilled in the art. Moreover, the LED module 100 may have a laser diode unit as the semiconductor light emitting unit, for example.

The fluorescent portion 106 is filled in the cavity 109, thereby covering the surface of the light emitting diode unit 102, and generates a red light, a green light and a blue light depending on the ultraviolet light generated from the light emitting diode unit 102. Consequently, the LED module 100 generates a white light. In the case in which the light emitting diode unit 102 generates the blue light, the fluorescent portion 106 may generate a light having a yellow color to be the complementary color of a blue color depending on the blue light generated from the light emitting diode unit 102. In this case, the LED module 100 generates the white light based on the blue light and the yellow light which are generated from the light emitting diode unit 102 and the fluorescent portion 106.

The sealing member 108 is a mold for sealing the light emitting diode unit 102 and the fluorescent portion 106. The sealing member 108 is formed by a transparent material to the white light in order to be opposed to the light emitting diode unit 102 with the fluorescent portion 106 interposed therebetween. Consequently, the sealing member 108 transmits the light generated from the fluorescent portion 106 and emits the same light to the outside of the LED module 100. The LED module 100 can properly generate the white light and can irradiate the same white light onto the outside.

In another example, the LED module 100 may have a plurality of light emitting diode units 102. In this case, the fluorescent portion 106 is provided to cover the light emitting diode units 102 in common, for example. Moreover, the sealing member 108 seals the light emitting diode units 102 and the fluorescent portion 106.

Figure 5:
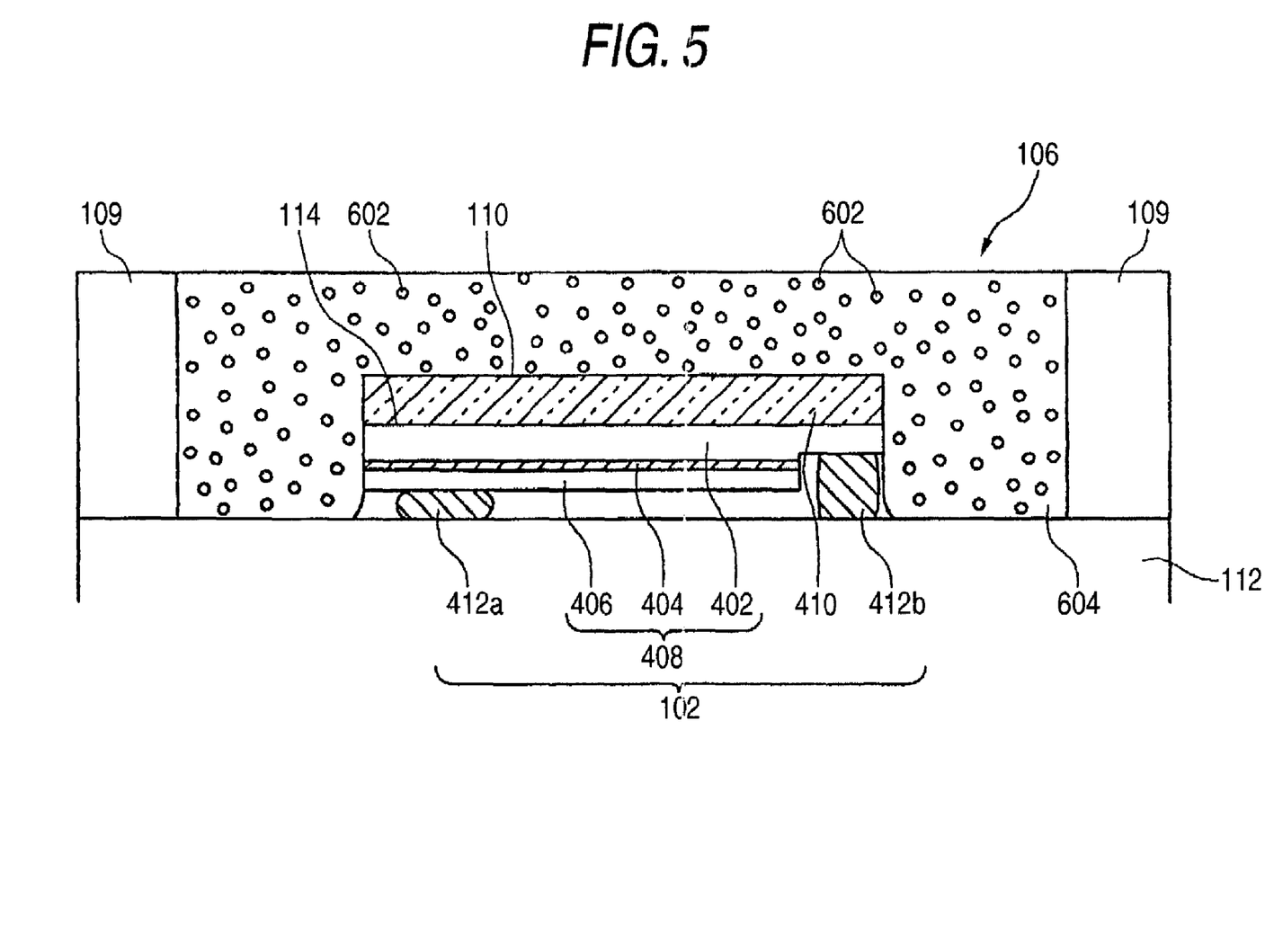
FIG. 5 is a view showing an example of the detailed structures of a light emitting diode unit and a fluorescent portion according to the exemplary, non-limiting embodiment of the present invention.

FIG. 5 shows an example of the detailed structures of the light emitting diode unit 102 and the fluorescent portion 106 together with the substrate 112 and the cavity 109. For convenience of explanation, the ratio of the sizes of the portions is shown by using a different ratio from an actual ratio, and is not necessarily proportional. The light emitting diode unit 102 has a plurality of electrodes 412a and 412b, a sapphire substrate 410 and a semiconductor layer 408, and is flip chip mounted on the substrate 112 in such a manner that the sapphire substrate 410 and the substrate 112 are opposed to each other with the semiconductor layer 408 interposed therebetween. The electrodes 412a and 412b are solder bumps that electrically connect the semiconductor layer 408 to the substrate 112.

The sapphire substrate 410 transmits the light generated from the semiconductor layer 408 toward the sealing member 108. The sapphire substrate 410 irradiates the transmitted light, to the fluorescent portion 106, from an opposed surface 110 to the sealing member 108. The opposed surface 110 is a plane having a square shape of approximately 1 mm square, for example.

The semiconductor layer 408 is formed by a crystal growth over a back face 114 of the opposed surface 110 in the sapphire substrate 410 and generates a light toward the sapphire substrate 410. In the example, the semiconductor layer 408 has an N type GaN layer 402, an InGaN layer 404 and a P type GaN layer 406. The N type GaN layer 402, the InGaN layer 404 and the P type GaN layer 406 are sequentially provided on the back face 114 of the sapphire substrate 410. The semiconductor layer 408 may have another layer between these layers.

In the example, the semiconductor layer 408 generates an ultraviolet light having a wavelength of approximately 360 to 380 nm toward the sapphire substrate 410 depending on the power received through the electrodes 412a and 412b and the substrate 112, for example. Consequently, the light emitting diode unit 102 generates an ultraviolet light toward the fluorescent portion 106 by setting the opposed surface 110 of the sapphire substrate 410 to be a light emitting surface. In another example, the semiconductor layer 408 may generate a blue light toward the sapphire substrate 410.

The fluorescent portion 106 has a binder 604 and a plurality of nanophosphor particles 602. In the example, the fluorescent portion 106 has plural kinds of nanophosphor particles 602 for generating lights having different colors from each other. The binder 604 is formed by a silicone resin or a fluorine resin to cover the opposed surface 110 to be the light emitting surface of the light emitting diode unit 102. Moreover, the binder 604 includes a plurality of nanophosphor particles 602 therein. Consequently, the binder 604 holds the nanophosphor particles 602 like a layer covering the light emitting surface of the light emitting diode unit 102. In this case, it is preferable but not required that the nanophosphor particles 602 in the binder 604 be dispersed at a uniform density. The nanophosphor particle 602 is dispersed into the binder 604 by using an ultrasonic homogenizer, for example but not by way of limitation.

In another non-limiting exemplary embodiment, the nanophosphor particle 602 may be provided in the sealing member 108 in place of the binder 604. Moreover, the fluorescent portion 106 may have a single kind of nanophosphor particles 602. For example but not by way of limitation, when the semiconductor light emitting unit 102 generates a blue light, the fluorescent portion 106 may have the nanophosphor particle 602 for generating a yellow light corresponding to the blue light.

The nanophosphor particle 602 is a phosphor particle for generating a fluorescent light corresponding to the ultraviolet light generated from the light emitting diode unit 102. Respective kinds of nanophosphor particles 602 generate a red light, a green light and a blue light depending on the ultraviolet light generated from the light emitting diode unit 102, respectively. In another example, the nanophosphor particle 602 may generate a light having a yellow color to be the complementary color of a blue color depending on the blue light generated from the semiconductor layer 408.

Moreover, the nanophosphor particle 602 is formed by doping a crystal having any of ZnS, CdS, ZnSe and CdSe as a parent with any of Mn2+, Eu3+, Tb3+ and Te as an active center, for example. Each of the nanophosphor particles 602 includes approximately $10^2$ to $10^4$ atoms or ions to be the active center, for example.

It is preferable that a radius R of the nanophosphor particle 602 should be equal to or smaller than a Bohr radius $a_B$ of an exciton in the nanophosphor particle 602. In this case, the overlap of the wave function of an electron and a hole is increased by a quantum confinement effect. Consequently, the nanophosphor particle 602 can convert the irradiated ultraviolet light into a visible light at a high efficiency. In the nanophosphor particle 602, moreover, the overlap of the wave function of the electron and the hole is changed depending on a size. According to the example, therefore, it is possible to control the lifetime of a light generated through a fluorescence by varying the size of the nanophosphor particle 602, for example. It is preferable that the radius R of the nanophosphor particle 602 should be set within a range in which the nanophosphor particle 602 generates a visible light.

In the example, the diameter of the nanophosphor particle 602 is approximately 2 to 10 nm, for example, and is smaller than the half-wavelength of the light generated from the LED module 100 (see FIG. 3). Therefore, the nanophosphor particle 602 is transparent to the visible light. In this case, the visible light generated from each of the nanophosphor particles 602 is not intercepted by the other nanophosphor particles 602 but is transmitted through the binder 604. Consequently, the light generated from the nanophosphor particle 602 can be utilized efficiently. Thus, it is possible to provide the LED module 100 having a substantially high external quantum efficiency.

In another example, the diameter of the nanophosphor particle 602 may be larger than about 10 nm and may be equal to or smaller than a ¼ wavelength of the visible light. In this case, it is possible to manufacture the nanophosphor particle 602 at a substantially low cost. By setting the diameter of the nanophosphor particle 602 to be smaller than the ¼ wavelength of the visible light, moreover, it is possible to sufficiently maintain the transparency of the fluorescent portion 106. The wavelength of the visible light has the wavelength of the blue light, for example but not by way of limitation. The nanophosphor particle is a phosphor particle having a diameter which is smaller than about 1 μm, for example.

In some cases in which the external quantum efficiency of the LED module 100 is low, the lighting unit 10 for a vehicle is heated by the generation of a heat of the LED module 100. In some cases, moreover, the lighting unit 10 for a vehicle is used in a harsh environment, for example, outdoors under the burning sun, and the radiation is hard to perform. In some cases in which the lighting unit 10 for a vehicle is heated by turning on the LED module 100, the lighting unit 10 for a vehicle cannot be properly turned on. According to the example, however, it is possible to prevent the lighting unit 10 for a vehicle from being heated by turning on the LED module 100 at a high external quantum efficiency. Consequently, the lighting unit 10 for a vehicle can be properly turned on.

The external quantum efficiency indicates the rate of the number of photons exiting the LED module 100 to a current flowing to the light emitting diode unit 102. The number of the photons indicates photons of a visible light to be used for creating the light distribution of the lighting unit 10 for a vehicle, for example. The number of the photons may be that of photons generated from the nanophosphor particle 602. Moreover, the half-wavelength of the light generated from the LED module 100 indicates that of a blue light included in a white light, for example. The radius and diameter of the nanophosphor particle 602 indicates that of a virtual sphere which is circumscribed on the nanophosphor particle 602, for example.

When the radius R of the nanophosphor particle 602 is almost equal to the Bohr radius $a_B$ of an exciton in a bulk crystal, moreover, a minimum excitation energy $E_1$ of the nanophosphor particle 602 is obtained in the following Equation 1. The Bohr radius $a_B$ represents the Bohr radius of the exciton in the bulk crystal of a phosphor formed in the same chemical composition as the nanophosphor particle 602, for example. In the following Equation 1, moreover, Eg represents a band gap in the bulk crystal, and $m_e$ and $m_h$ represent effective masses of an electron and a hole.

$$E_1 = E_g + \frac{\hbar^2 \pi^2}{2R^2}\left[\frac{1}{m_e} + \frac{1}{m_h}\right]$$ [Equation 1]

In this case, the band gap of the nanophosphor particle 602 is changed depending on the size of the nanophosphor particle 602. In the case in which the radius R is approximately equal to or smaller than the Bohr radius $a_B$, moreover, a frequency $f_{QD}$ of an emitted light corresponding to a minimum excitation state (is type) is obtained in the following Equation 2 by an effective mass approximation. $f_b$ represents a vibrator intensity in the bulk crystal.

$$f_{QD} = f_b\left[\frac{a_B}{R}\right]^3$$ [Equation 2]

In this case, it is possible to change the wavelength of a light generated from the nanophosphor particle 602 by varying the size of the nanophosphor particle 602. In this case, moreover, the influence of a second term in the Equation 1 is increased. Therefore, it is possible to change the band gap of the nanophosphor particle 602 within a wide range by varying the size of the nanophosphor particle 602.

Figure 6:
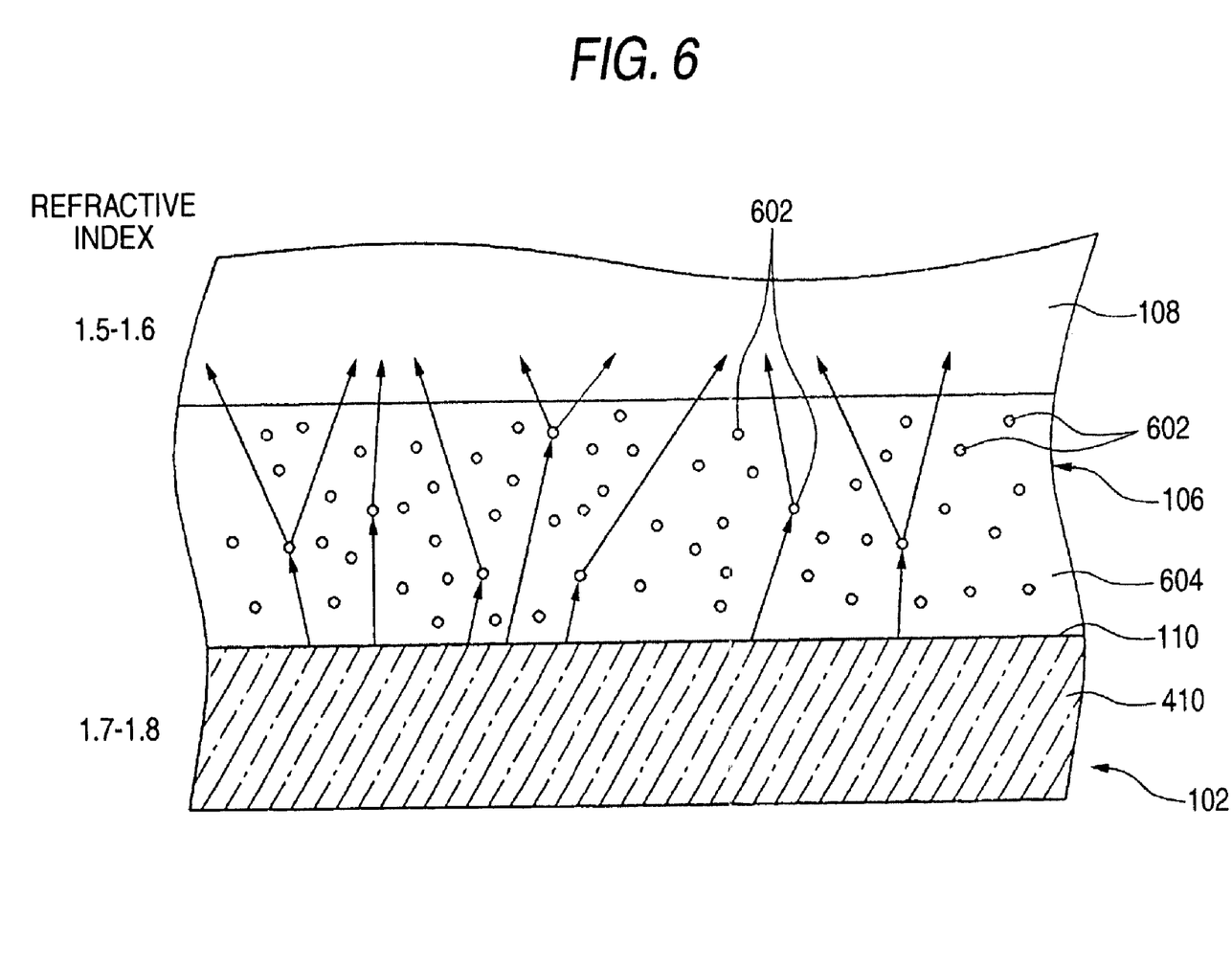
FIG. 6 is a detailed view of a sealing member according to the exemplary, non-limiting embodiment of the present invention.

FIG. 6 is a more detailed view of the sealing member 108. The sealing member 108 is formed to cover the binder 604 and the light emitting diode unit 102, thereby sealing the binder 604 and the light emitting diode unit 102. In the example, the sealing member 108 is opposed to the sapphire substrate 410 with the fluorescent portion 106 interposed therebetween. The sapphire substrate 410 has a refractive index of approximately 1.7 to 1.8.

For this reason, it is preferable that the sealing member 108 should have a refractive index of 1.45 or more. In this case, a difference between the refractive index of the sealing member 108 and that of the light emitting diode unit 102 is reduced. Consequently, it is possible to efficiently take out the light generated from the light emitting diode unit 102. In the example, the sealing member 108 is formed by an epoxy resin. The epoxy resin may be bisphenol A type epoxy (clear epoxy), biphenyl epoxy or alicyclic epoxy, for example. In this case, the sealing member 108 has a refractive index of approximately 1.5 to 1.6.

In some cases in which the epoxy resin is subjected to the irradiation of an ultraviolet light, it is turned to be yellow, thereby causing deterioration. Therefore, the sealing member 108 is also deteriorated and the external quantum efficiency of the LED module 100 is thus reduced if the fluorescent portion 106 transmits the ultraviolet light emitted from the light emitting diode unit 102.

In the example, however, the nanophosphor particle 602 is transparent to a visible light. Therefore, the nanophosphor particles 602 can be formed like a layer in a sufficient thickness for converting all of the ultraviolet lights emitted from the light emitting diode unit 102 into visible lights. Consequently, the nanophosphor particle 602 held in the binder 604 convert, into visible lights, all of the ultraviolet lights generated from the light emitting diode unit 102. According to the example, therefore, it is possible to prevent the sealing member 108 from being deteriorated due to the ultraviolet light. Consequently, it is possible to select the material of the sealing member 108 without taking a light resistance to the ultraviolet light into consideration. Furthermore, it is possible to prevent another resin material in the lighting unit 10 for a vehicle (see FIG. 1) from being deteriorated due to the ultraviolet light.

If the nanophosphor particle 602 is opaque to a visible light, a visible light generated from the nanophosphor particle 602 to be a lower layer is intercepted by the nanophosphor particle 602 to be an upper layer when the layer of the nanophosphor particle 602 is made thick. In this case, a part of the light generated from the nanophosphor particle 602 is lost. Consequently, the external quantum efficiency of the LED module 100 is reduced. According to the example of the present invention, however, the light generated from the nanophosphor particle 602 can be utilized at a high efficiency. Consequently, it is possible to provide the LED module 100 having a high external quantum efficiency.

The sealing member 108 may have a lower refractive index than the binder 604. In this case, the refractive index of the binder 604 is lower than that of the light emitting diode unit 102 and is higher than that of the sealing member 108. Moreover, it is preferable that the nanophosphor particle 602 should have a higher refractive index than the material of the binder 604. The nanophosphor particle 602 has a refractive index of about 2 or more, for example. In this case, the refractive index of the binder 604 is higher than that of the material of the binder 604. Consequently, the critical angle of a light incident on the binder 604 from the light emitting diode unit 102 is increased. According to the example, therefore, the reflection of an ultraviolet light over an interface between the light emitting diode unit 102 and the binder 604 is reduced.

In another example, the light emitting diode unit 102 may be mounted in such a manner that the sapphire substrate 410 and the fluorescent portion 106 are opposed to each other with the semiconductor layer 408 (see FIG. 5) interposed therebetween. The semiconductor layer 408 has a refractive index of approximately 2.3 to 2.5, for example. Also in this case, it is also possible to provide the LED module 100 having a high external quantum efficiency by forming the sealing member 108 with a material having a high refractive index, for example, an epoxy resin.

Figure 7:
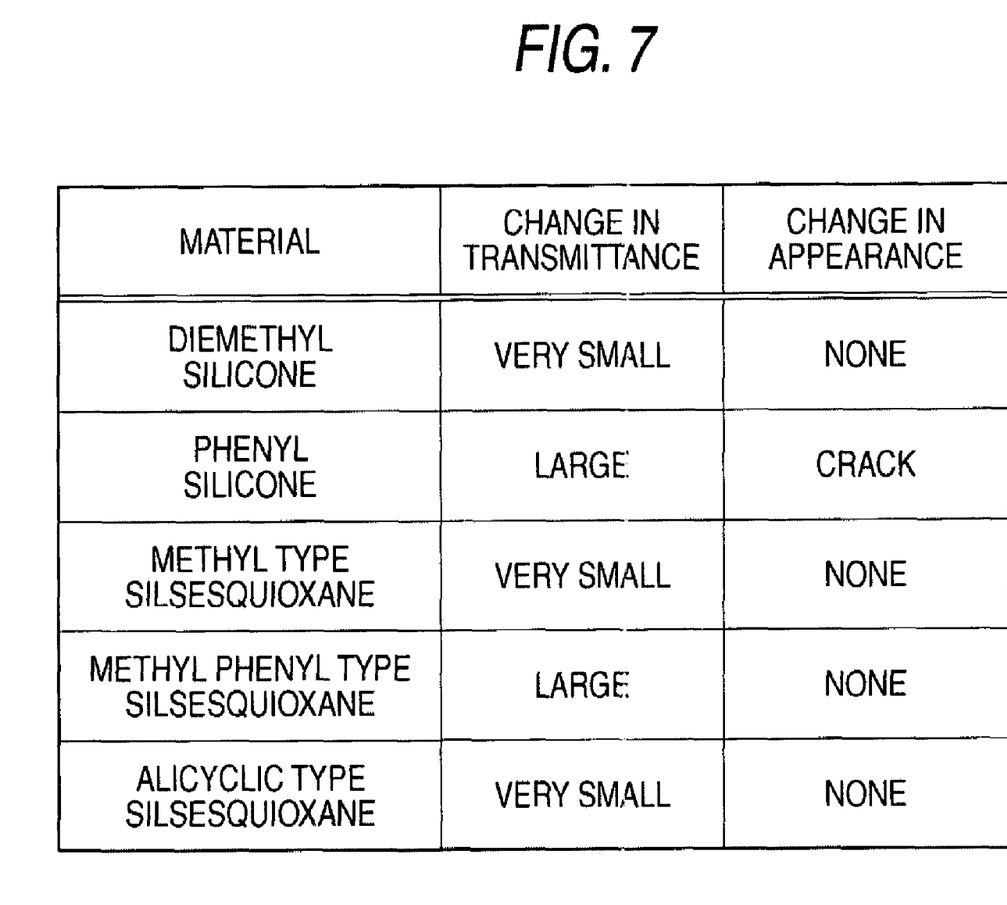
FIG. 7 is a table showing the result of a light resistance test for a binder according to the exemplary, non-limiting embodiment of the present invention.

FIG. 7 is a table showing the result of a light resistance test for the binder 604. In the light resistance test, an ultraviolet light having a wavelength of 365 nm was irradiated on five kinds of materials shown in the table at an illuminance of 9.5 W/cm$^2$ for about 150 hours.

As a result, a change in a spectral transmittance was very small and an appearance was not varied in a dimethyl silicone resin, a methyl type silsesquioxane resin and an alicyclic type silsesquioxane resin. Thus, an excellent result was obtained. On the other hand, the amount of the change in the spectral transmittance was increased in other materials.

The silsesquioxane resin is a network-like silicone resin of a ladder type or a cage type, for example. The silicone resin is polysiloxane having a polymer chain structure in which a silicon-oxygen bond is repeated, for example. Moreover, the methyl type silsesquioxane resin is an example of a silsesquioxane resin to be alkyd in which a side chain has no double bond. The alkyd has a polymer chain structure obtained by a bond of polyhydric alcohol and polybasic acid, for example. Moreover, an alicyclic type silsesquioxane resin is an example of a silsesquioxane resin in which a side chain is an alicyclic group.

For this reason, it is preferable that the binder 604 should be formed by a dimethyl silicone resin or a silsesquioxane resin. It is preferable that the side chain of the silsesquioxane resin should be the alkyd having no double bond or the alicyclic group. Furthermore, it is preferable that the silsesquioxane resin has no phenyl group in a side chain.

In the lighting unit 10 for a vehicle, the light emitting diode unit 102 emits a light at an efficiency of about 50 lm/W or more in some cases, for example. In these cases, the illuminance of the ultraviolet light generated from the light emitting diode unit 102 is about 1 to 20000 times as high as that of sunlight, for example.

When a light resistance to the ultraviolet rays of the material of the binder 604 is low, therefore, the binder 604 is turned to be yellow, thereby causing deterioration. In these cases, a luminous flux is reduced or a luminescent color is changed. According to the example, however, it is possible to form the binder 604 having a high light resistance by using a dimethyl silicone resin or a silsesquioxane resin. Furthermore, the dimethyl silicone resin can be formed at a low cost in a simple process and also has an excellent thermostability, for example. According to the example, therefore, the binder 604 having a high performance can be formed at a substantially low cost.

The dimethyl silicone resin has a refractive index of approximately 1.3 to 1.4. If the refractive index of the binder 604 is almost equal to that of the dimethyl silicone resin, therefore, a critical angle on an interface between the binder 604 and the light emitting diode unit 102 is decreased so that a luminous flux incident on the binder 604 from the light emitting diode unit 102 is reduced. For example, the critical angle is decreased from about 30 degrees to about 26 degrees as compared with the case in which the binder 604 has a high refractive index which is almost equal to the refractive index of an epoxy resin. In this case, the luminous flux is reduced by approximately 10 to 15%.

As described with reference to FIG. 6, however, the binder 604 includes the nanophosphor particle 602 and thereby has a higher refractive index than the material of the binder 604 in the example. According to the example, the light generated from the light emitting diode unit 102 can be efficiently incident on the binder 604 even if the binder 604 is formed by a material having a low refractive index, for instance. Consequently, the binder 604 can be formed by a material having a high light resistance to the ultraviolet rays. According to the example, therefore, it is possible to efficiently utilize the ultraviolet light generated from the light emitting diode unit 102. Consequently, it is possible to increase the luminous efficiency of the LED module 100.

Figure 8:
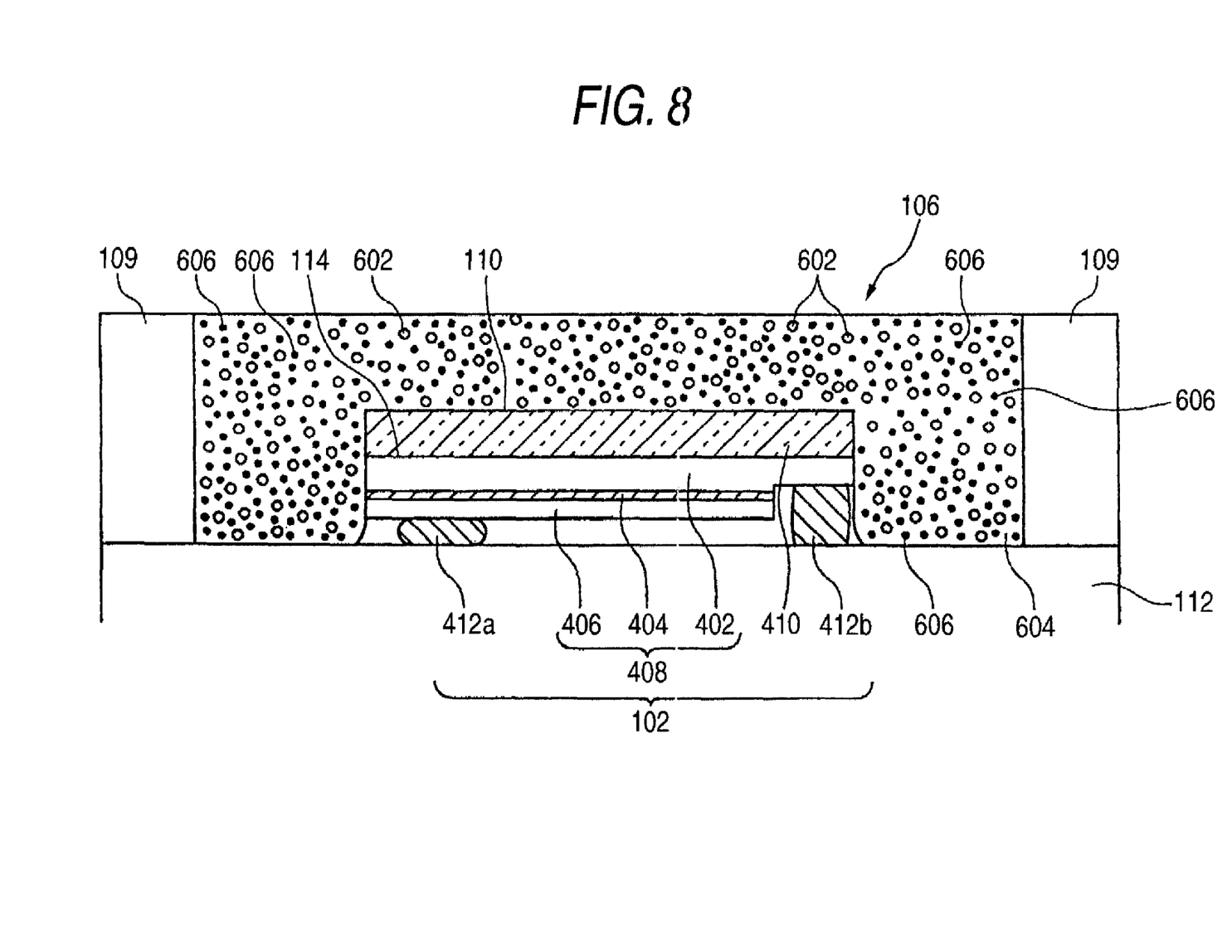
FIG. 8 is a view showing another non-limiting example of the detailed structures of the light emitting diode unit and the fluorescent portion according to the present invention.

FIG. 8 shows another example of the detailed structures of the light emitting diode unit 102 and the fluorescent portion 106 together with the substrate 112 and the cavity 109. In FIG. 8, the structures having the same reference numerals as those in FIG. 5 have identical or similar functions to those of the structures in FIG. 5, and therefore, description will be omitted.

In the example, the fluorescent portion 106 further has a plurality of metal oxide particles 606. The metal oxide particles 606 have diameters of about 10 nm or less and are held in the binder 604 together with the nanophosphor particles 602.

Since the metal oxide particles 606 have diameters which are equal to or smaller than the half-wavelength of the ultraviolet light, they are transparent to the ultraviolet light. Moreover, the metal oxide particle 606 has a refractive index of about 2 or more and is uniformly dispersed into the binder 604. According to the example, therefore, it is possible to further increase the refractive index of the binder 604. Consequently, the ultraviolet light generated from the light emitting diode unit 102 can be utilized efficiently.

Figure 9:
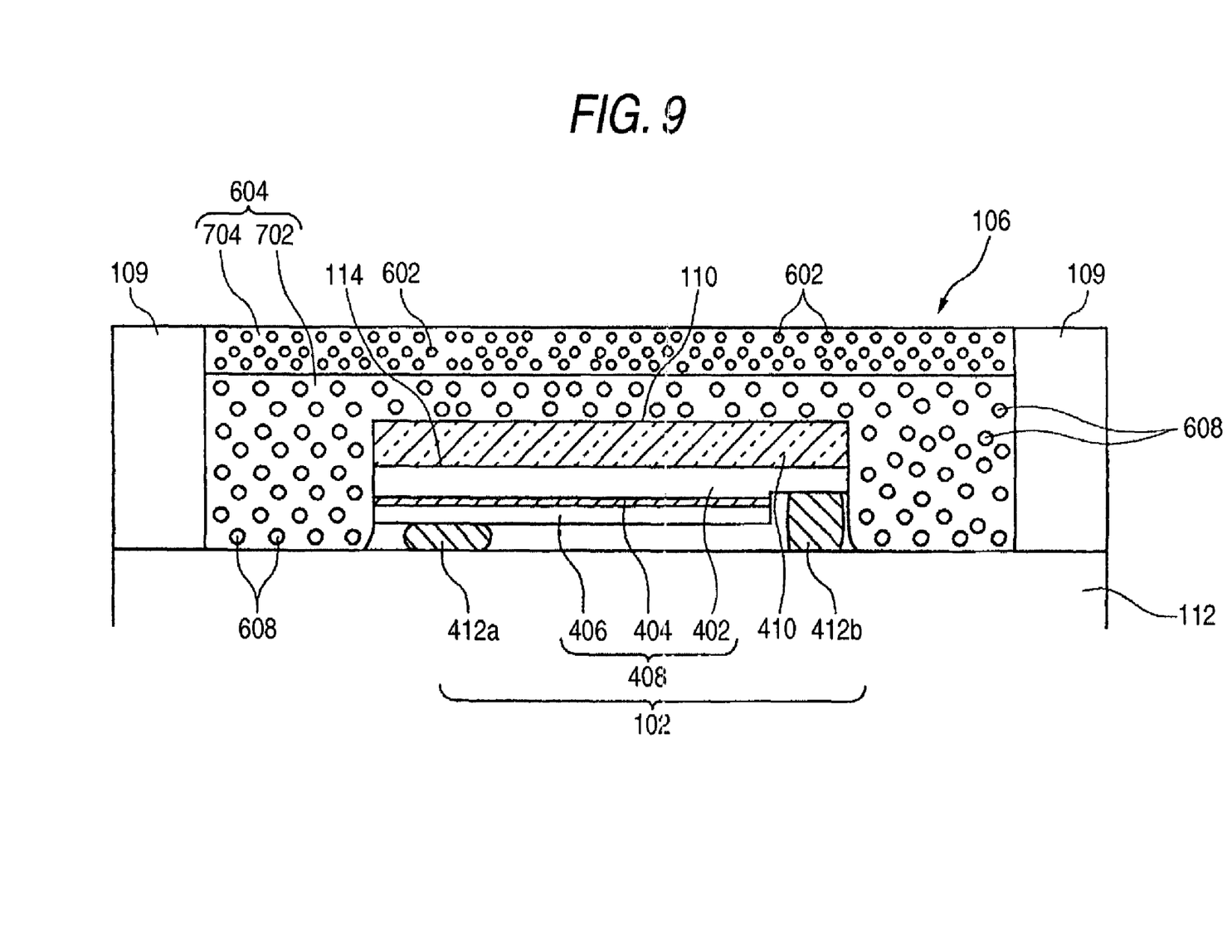
FIG. 9 is a view showing a further non-limiting example of the detailed structures of the light emitting diode unit and the fluorescent portion according to the present invention.

FIG. 9 shows a further example of the detailed structures of the light emitting diode unit 102 and the fluorescent portion 106 together with the substrate 112 and the cavity 109. In FIG. 9, the structures having the same reference numerals as those in FIG. 5 have identical or similar functions to those of the structures in FIG. 5, and therefore, description will be omitted for the sake of brevity.

The fluorescent portion 106 further has a plurality of large diameter phosphor particles 608. The large diameter phosphor particles 608 are phosphor particles having larger diameters than the half-wavelength of a visible light, respectively. Moreover, the binder 604 includes a plurality of holding layers 702 and 704.

The holding layer 702 is formed to cover the opposed surface 110 to be the light emitting surface of the light emitting diode unit 102. Moreover, the holding layer 702 includes the large diameter phosphor particles 608 therein. Consequently, the holding layer 702 holds the large diameter phosphor particles 608 on the opposed surface 110. The holding layer 704 is formed opposite to the opposed surface 110 with the holding layer 702 interposed therebetween. Moreover, the holding layer 704 includes a plurality of nanophosphor particles 602 therein. Consequently, the holding layer 704 holds the nanophosphor particles 602 on the holding layer 702.

The large diameter phosphor particles 608 held in the holding layer 702 convert a part of the ultraviolet light generated from the light emitting diode unit 102 into a visible light. Consequently, the holding layer 702 transmits, to the holding layer 704, a part of the ultraviolet light generated from the light emitting diode unit 102 and the visible lights generated from the large diameter phosphor particles 608.

Moreover, the nanophosphor particles 602 held in the holding layer 704 convert all of ultraviolet lights incident from the holding layer 702 into visible lights. Consequently, the holding layer 704 transmits, to the outside of the binder 604, the visible lights generated from the large diameter phosphor particles 608 and the visible lights generated from the nanophosphor particles 602.

In the example, the nanophosphor particle 602 generates a light having a part of three primary colors of a light, for instance. Moreover, the large diameter phosphor particle 608 generates lights having the other colors of the three primary colors of the light. It is preferable that the large diameter phosphor particle 608 should generate a visible light having a different wavelength from the wavelength of the visible light generated from the nanophosphor particle 602 corresponding to a violet light. According to the example, a part of the colors can be generated from the large diameter phosphor particle 608 and the other colors can be generated from the nanophosphor particle 602. Consequently, it is possible to properly use the nanophosphor particle 602 and the large diameter phosphor particle 608 depending on cost and stability.

Also in the example, moreover, the nanophosphor particle 602 in the holding layer 704 converts, into visible lights, substantially all of the ultraviolet lights incident from the light emitting diode unit 102 through the holding layer 702. Therefore, it is possible to prevent the sealing member 108 (see FIG. 3) from being deteriorated due to the ultraviolet light.

While the invention has been described above with reference to the embodiment, the technical range of the invention is not restricted to the range described in the embodiment. It is apparent to the skilled in the art that the embodiment can be changed or improved variously. It is apparent from the description of the claims that the embodiment thus changed or improved variously can also be included in the technical range of the invention.

The invention claimed is:

1. A light emitting module for generating an output light, comprising:
   a semiconductor light emitting unit that generates a source light;
   a plurality of nanophosphor particles that have diameters smaller than a half-wavelength of the output light and emit a fluorescent light corresponding to the light generated from the semiconductor light emitting unit; and
   a binder that holds the nanophosphor particles as a layer that covers a light emitting surface of the semiconductor light emitting unit;
   wherein the semiconductor light emitting unit generates an ultraviolet light,
   wherein the nanophosphor particles generate a visible light corresponding to the ultraviolet light generated from the semiconductor light emitting unit, and
   wherein the binder comprises at least one of a fluorine resin and a dimethyl silicone resin so as to cover the light emitting surface of the semiconductor emitting unit with the nanophosphor particles.

2. The light emitting module according to claim 1, wherein each of the nanophosphor particles has a diameter of about 2 to 10 nm.

3. The light emitting module according to claim 1, wherein each of the nanophosphor particles has a diameter larger than about 10 nm and substantially equal to or smaller than a ¼ wavelength of a visible light.

4. The light emitting module according to claim 1, further comprising a plurality of metal oxide particles having diameters substantially equal to or smaller than a half-wavelength of an ultraviolet light, and held in the binder with the nanophosphor particles.

5. The light emitting module according to claim 1, further comprising a sealing member made of a material that transmits a visible light, the binder and the semiconductor light emitting unit being sealed so as to cover the binder and the semiconductor light emitting unit, and wherein
   the nanophosphor particles are held in the binder converting, into visible lights, all of the ultraviolet lights generated from the semiconductor light emitting unit.

6. The light emitting module according to claim 5, wherein the sealing member is made of an epoxy resin.

7. The light emitting module according to claim 1, further comprising a plurality of large diameter phosphor particles having diameters substantially larger than a half-wavelength of the visible light, and that generate a visible light having a substantially different wavelength from a wavelength of the visible light generated from the nanophosphor particle corresponding to an ultraviolet light,
   the binder including:

a first holding layer that covers the light emitting surface of the semiconductor light emitting unit and holds the large diameter phosphor particles on the light emitting surface; and a second holding layer opposite to the light emitting surface with the first holding layer interposed therebetween and that holds the nanophosphor particles on the first holding layer, the large diameter phosphor particles held in the first holding layer that converts, into a visible light, a part of an ultraviolet light generated from the semiconductor light emitting unit, the first holding layer transmitting, to the second holding layer, a part of the ultraviolet light generated from the semiconductor light emitting unit and the visible lights generated from the large diameter phosphor particles, the nanophosphor particles held in the second holding layer converting, into visible light, ultraviolet light incident from the first holding layer, and the second holding layer transmitting the visible light generated from the large diameter phosphor particles and the visible light generated from the nanophosphor particles to outside the binder.

8. A light emitting module for generating an output light, comprising:

a semiconductor light emitting unit that generates a source light;

a plurality of nanophosphor particles that have diameters smaller than a half-wavelength of the output light and emit a fluorescent light corresponding to the light generated from the semiconductor light emitting unit; a plurality of metal oxide particles having diameters substantially equal to or smaller than a half wavelength of an ultraviolet light, and a binder that holds the nanophosphor particles and the metal oxide particles as a layer that covers a light emitting surface of the semiconductor light emitting unit, wherein the semiconductor light emitting unit generates an ultraviolet light, wherein the nanophosphor particles generate a visible light corresponding to the ultraviolet light generated from the semiconductor light emitting unit, wherein the binder is formed by a silsesquioxane resin that covers the light emitting surface of the semiconductor light emitting unit with the nanophosphor particles and the metal oxide particles wherein a side chain of the silsesquioxane resin is alkyd having no double bond or an alicyclic group.

9. The light emitting module according to claim 8, wherein each of the nanophosphor particles has a diameter of about 2 to 10 nm.

10. The light emitting module according to claim 8, wherein each of the nanophosphor particles has a diameter larger than about 10 nm and substantially equal to or smaller than a ¼ wavelength of a visible light.

11. The light emitting module according to claim 8, further comprising a sealing member made of a material that transmits a visible light, the binder and the semiconductor light emitting unit being sealed so as to cover the binder and the semiconductor light emitting unit, and wherein the nanophosphor particles are held in the binder converting, into visible lights, all of the ultraviolet lights generated from the semiconductor light emitting unit.

12. The light emitting module according to claim 11, wherein the sealing member is made of an epoxy resin.

13. The light emitting module according to claim 8, further comprising a plurality of large diameter phosphor particles having diameters substantially larger than a half-wavelength of the visible light, and that generate a visible light having a substantially different wavelength from a wavelength of the visible light generated from the nanophosphor particle corresponding to an ultraviolet light, the binder including:

a first holding layer that covers the light emitting surface of the semiconductor light emitting unit and holds the large diameter phosphor particles on the light emitting surface; and a second holding layer opposite to the light emitting surface with the first holding layer interposed therebetween and that holds the nanophosphor particles on the first holding layer, the large diameter phosphor particles held in the first holding layer that converts, into a visible light, a part of an ultraviolet light generated from the semiconductor light emitting unit, the first holding layer transmitting, to the second holding layer, a part of the ultraviolet light generated from the semiconductor light emitting unit and the visible lights generated from the large diameter phosphor particles, the nanophosphor particles held in the second holding layer converting, into visible light, ultraviolet light incident from the first holding layer, and the second holding layer transmitting the visible light generated from the large diameter phosphor particles and the visible light generated from the nanophosphor particles to outside the binder.

* * * * *